United States Patent [19]

von Basse et al.

[11] 4,122,546
[45] Oct. 24, 1978

[54] MOS SEMICONDUCTOR STORAGE MODULE

[75] Inventors: Paul-Werner von Basse, Wolfratshausen; Ruediger Hofmann, Munich, both of Fed. Rep. of Germany

[73] Assignee: Siemens Aktiengesellschaft, Berlin & Munich, Fed. Rep. of Germany

[21] Appl. No.: 837,201

[22] Filed: Sep. 27, 1977

[30] Foreign Application Priority Data

Oct. 20, 1976 [DE] Fed. Rep. of Germany ....... 2647394

[51] Int. Cl.$^2$ ..................... G11C 7/00; G11C 11/40
[52] U.S. Cl. ..................... 365/189; 307/DIG. 3; 365/205
[58] Field of Search ............ 365/189, 205, 149; 307/238, DIG. 3

[56] References Cited

U.S. PATENT DOCUMENTS 3,983,545  9/1976  Cordaro ........................... 365/205

*Primary Examiner*—Stuart N. Hecker
*Attorney, Agent, or Firm*—Hill, Gross, Simpson, Van Santen, Steadman, Chiara & Simpson

[57] ABSTRACT

A MOS storage module has MOS transistor storage cells disposed between word and bit lines. A weighting network is symmetrically connected in each pair of bit lines for evaluating read signals. The weighting networks are arranged in a column with the storage cells which are connected to first inputs of the weighting networks form a first storage cell field and the storage cells which are connected to second inputs of the weighting networks form a second storage cell field and all storage cell fields on the storage module are disposed on one side of the column of weighting networks.

10 Claims, 8 Drawing Figures

MOS SEMICONDUCTOR STORAGE MODULE

BACKGROUND OF THE INVENTION

1. Field of the Invention

The invention relates to a MOS semiconductor storage module with MOS transistor storage cells disposed between word and bit lines, in which a weighting network is disposed symmetrically in two bit lines, in each case, for evaluating the read signals appearing on the bit lines, in which the weighting networks are arranged in a column, and in which the storage cells connected to the bit lines leading to first inputs of the weighting networks form a first storage cell field and the storage cells connected to the bit lines leading to second inputs of the weighting networks form a second storage cell field.

2. Description of the Prior Art

It is know for MOS stores to be designed such that an MOS transistor storage cell is disposed at the intersections of word and bit lines. Such a transistor storage cell can be a known single transistor storage cell, for example. In order to be able to evaluate the read signals appearing on the bit lines during the reading operation, which signals are however very small, one weighting network is disposed symmetrically in two bit lines in each case. Such a weighting network can be constituted by a symmetrical flip-flop, for instance. Then such a MOS store is built on a storage module from a column of weighting networks and two storage cell fields of which a first is disposed on one side of the column of weighting networks and a second on the other side of the column of weighting networks. Such a MOS store can be found for example in the periodical Electronics, Sept. 13, 1973, pages 117 to 121.

Since the read signals are very small, it must be ensured that the storage cell fields are formed on both sides of the weighting networks as symmetrically as possible. Therefore, when selecting a storage cell during the reading operation the disturbances occurring in the process must be equal on both sides of the weighting network, identical increases in capacitance must take place on both sides and the bit lines must be charged to the same bias level before the reading operation. These requirements can be satisfied using the following measures: The bit lines are charged up by identical charging transistors that are actuated by an identical charging timing signal. The disturbances that arise through the selection of a cell column on one side of the weighting network are equalized by identical disturbances by selecting so-called compensation cells (dummy cells) on the other side. The capacitive equilibrium on both sides of the weighting network is also achieved with the aid of the compensation cells which balance the increase in capacitance on the bit lines through the called cells. In addition, the capacitive imbalance which arises as a result of selecting a selector switch disposed between a bit line and a date line is corrected by a special equlization element on the other bit line associated with the same weighting network.

SUMMARY OF THE INVENTION

However with the known storage modules the requirements indicated above are only incompletely satisfied. The reason for this resides in the fact that the two cell fields separated by a column of weighting networks are relatively far apart and consequently manufacturing tolerances have a considerable effect on the properties of components such as transistors, capacitors, etc. The underlying object of the invention is to provide a MOS storage module in which the influence of manufacturing tolerances is largely eliminated during weighting of read signals. This object is achieved in that all the storage cell fields on the storage module are disposed on one side of the column of weighting networks.

It is expedient to arrange the weigting networks symmetrically between the two bit lines. Then, even with a small bit line grid, the weighting networks no longer have to be disposed in echelon.

At the points of intersection between a word line and the two bit lines associated with a weighting network, a storage cell is only provided at one point of intersection, an additional capacitor can be provided at the other intersection point. In this way the increase in capacitance when selecting a storage cell on one bit line can be offset with the aid of the additional capacitor. Disturbances occurring when the storage cell is selected appear in the same way on the other bit line as well. Since the storage cell and the capacitor are very close together, variations in tolerance affect both equally.

The bit lines associated with a weighting network are connected at their ends which are remote from the storage cells through selector switches to data lines. The signals read from a storage cell are output from the storage cell field on these data lines or new information to be recorded in the storage cell field is input into the storage cell field on these data lines. Two such data lines are provided, one data line in each case being connected to one bit line associated with a weighting network through a first selector switch, and the other data line to the other bit line associated with the weighting network through a second selector switch. The selector switches associated with one weighting network are actuated by one timing signal in common. In this design the selector switches are located immediately adjacent to one another on the storage module. Since they are also identical in design, they provide equal additional capacitance. Consequently, it is not necessary to provide additional compensation elements.

It is also expedient if a read amplifier is disposed between the two data lines. Since complementary signals appear on the two data lines during the reading operation, this enables the read amplifier to function faster and more reliably.

Before a reading operation can start, the bit lines must be charged up by means of charging transistors. These charging transistors are also closely grouped on the module. This means that the disturbances appearing on the bit lines through actuation of the charging transistors are the same for both the bit lines associated with one weighting network.

A large storage cell field can be divided into a plurality of storage cell fields, each storage cell field exhibiting its own column of weighting networks. The individual storage fields with their columns of weighting networks can be connected one behind another. In this way the bit lines become shorter with a consequent reduction in bit line capacitance and amplification of the read signals.

A further advantage of the MOS storage module, in accordance with the invention, is that during the recording operation the information passes directly to the weighting network and the two bit lines along the two data lines and the selector switches in complementary form. This means a reduction in recording time.

BRIEF DESCRIPTION OF THE DRAWINGS

Other objects, features and advantages of the invention, its organization, construction and operation will be best understood from the following description taken in conjunction with the accompanying drawings, on which.

DESCRIPTION OF THE PREFERRED EMBODIMENTS

Figure 1:
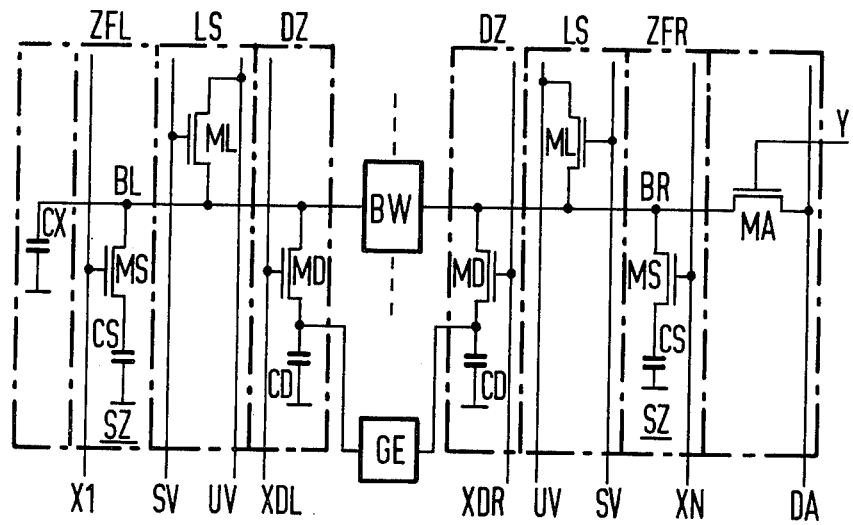
FIG. 1 is a schematic circuit diagram of a known MOS store.

FIG. 1 shows a known store with single transistor storage cells SZ. The single transistor storage cells SZ comprise a selection transistor MS and a storage capacitor CS. The selection transistor is connected by its gate to a word line X and by a controlled electrode to a bit line B. The bit line B is connected to a weighting network BW. Here two bit lines, namely BL and BR, are provided per weighting BW. One bit line BL is connected to one input of the weighting network BW, the other bit line BR to the other input of the weighting network BW. In the example of FIG. 1, only one storage cell is provided on each side of the weighting network BW. In the example of FIG. 1, only one storage cell is provided on each side of the weighting network BW. But is is obvious that a larger number of such storage cells are connected to the bit lines BL and BR on both sides. These then form storage cell fields ZF, producing a left-hand storage cell field ZFL and a right-hand storage cell field ZFL and a right-hand storage cell field ZFR.

In the example of FIG. 1, only one weighting network BW is shown with its two bit lines BL and BR. In reality, a greater number of such weighting networks BW are disposed in a column one above another. This is indicated in FIG. 1 by the broken lines extending from the weighting network BW.

In addition to the storage cell fields ZFL and ZFR, provision is made for a column LS for the charging transistors ML. With the aid of the charging transistors ML the bit lines BL and BR are charged up before the reading operation.

Moreover, on both sides of the weighting networks BW there is a column of compensation cells DZ consisting of a transistor MD and a capacitor CD. The compensation cells (dummy cells) are designed to ensure that when a storage cell is selected the resultant increase in capacitance on one bit line and the dusturbances transmitted to the bit line through this are equalized by actuating the compensation cell on the other side of the weighting network BW. The compensation cells are connected to a generator GE through which the capacitor CD is charged up to a moderate voltage in a manner well known in the art.

Finally, one bit line, namely the bit line BR, is connected through a selection transistor MA to a data line DA. When a timing signal Y is applied at the selection transistor MA, the bit line BR is connected with the data line DA and information can be exchanged between the data line DA and the bit line BR. The capacitive charging from the selection transistor MA on bit line BR is balanced on the other bit line BL by a compensating capacitor CX.

Other quantities shown in FIG. 1 are the charging timing signal SV with which the charging transistors ML are actuated, the charging voltage UV which is applied through the charging transistors ML to the bit line B, the actuating lines XDL and XDR for the compensation cells and the word lines X1, XN.

One disadvantage of this known store is that, as is clearly shown in FIG. 1, the two storage cell fields ZFL and ZFR are separated from one another by a column of weighting networks BW and lie fairly far apart. This makes it easily possible for the properties of the transistors and capacitors in the two storage cell fields to differ and thus right at the design stage different conditions apply at the two inputs of a weighting network BW.

Figure 2:
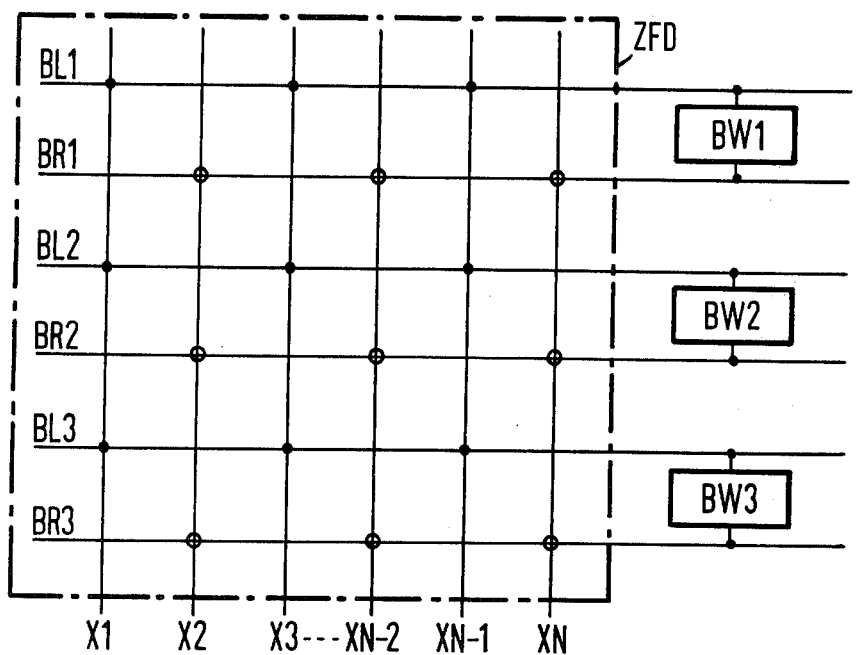
FIG. 2 is a schematic illustration of the principles of the invention.

It can be seen from FIG. 2 just how this disadvantage in the design of the known store is overcome. Here only the basic storage cell field is shown, marked by ZFD. The essential thing is that this storage cell field ZFD, in which the two storage cell fields ZFL and ZFR in FIG. 1 are combined, is disposed entirely on one side of the column of weighting networks BW. The storage cells which are the points of intersection between word and bit lines are shown by small circles in FIG. 2. Here, the circles that are filled in indicate the points at which storage cells of storage cell field ZFL were disposed in the known arrangement while the circles that are not filled in denote points at which storage cells of the other storage cell field ZFR were located in the known arrangement. This illustration is merely intended to allow comparison of the store in FIG. 2 with the known arrangement of FIG. 1.

In the illustration of FIG. 2, three pairs of bit lines BL and BR are provided, these being connected to associate weighting networks BW1 to BW3. Here, one weighting network BW is always located between its two associated bit lines, thus, for example, weighting networks BW1 between bit lines BL1 and BR1. The weighting networks BW lie in a column one above another. The word lines are denoted in FIG. 2 by X1, X2, X3, XN-2, XN-1 and XN.

Figure 3:
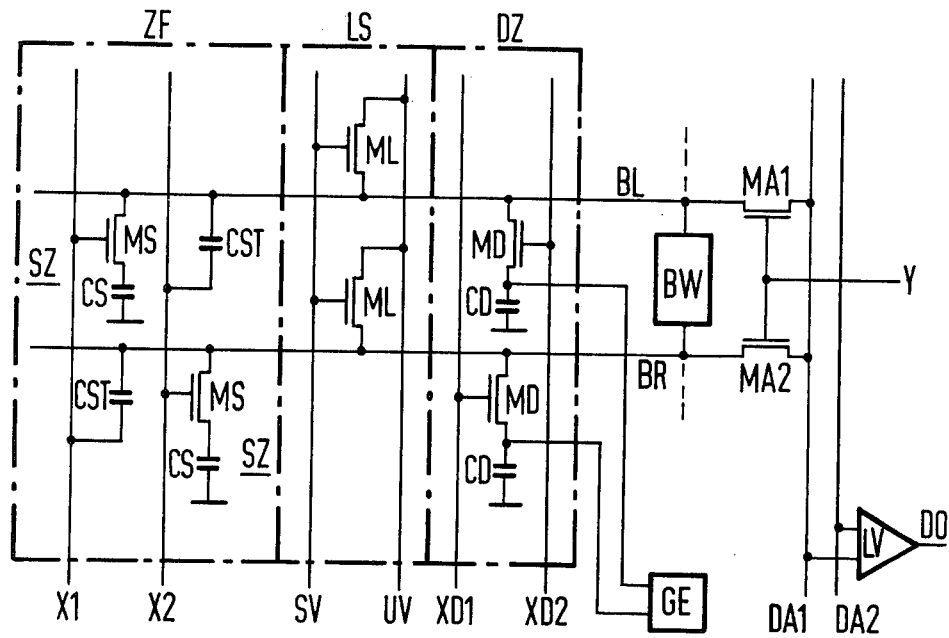
FIG. 3 is a schematic circuit diagram of a section of a store constructed in accordance with the invention.

A more precise illustration of the store of FIG. 2 is given in FIG. 3. Here again only a section of the store is shown—i.e. a weighting network BW with the associated bit lines BL, BR and the units connected to these bit lines BL, BR.

The storage cell field ZF has two word lines X1 and X2 and two storage cells SZ. One storage cell lies between the word line X1 and the bit line BL, the other storage cell between the word line X2 and the bit line BR. In each case they are single transistor storage cells comprising a selection transistor MS and a storage capacitor CS and designed in the known manner. Near the cell field ZF there is a column LS with charging transistors ML. The charging transistors ML are actuated by a charging timing signal SV and then apply a charging potential UV to bit line BL or BR. Near the column LS with the charging transistors ML there is a column DZ with compensation cells. These consist in the known way of a transistor MD and a capacitor CD just like the storage cells. A generator GE which charges the capacitors CD up to a moderate level in the pauses is provided for their operation.

The weighting network BW is disposed near the cell field ZF, the column LS with the charging transistors and the column DZ with the compensation cells. The broken lines above and below the weighting network BW are intended to indicate that the store consists of a whole column of such weighting networks BW. Here, the weighting network BW lies between its two bit lines BL and BR. At their ends which are remote from the storage cell field the bit lines BL and BR are each connected to a data line DA1, DA2 through selector switches MA1, MA2. They are actuated simultaneously by a selection signal Y. Disposed between the data lines DA1 and DA2 there is a read amplifier LV at the output of which an amplified read signal DO can be emitted. The date lines DA1, DA2 are common to all the bit lines of a storage cell field.

When a storage cell, e.g. the one adjoining word line X1, is actuated, the associated selection transistor MS is rendered conductive and an exchange of charge can take place between the storage capacitor CS and the bit line BL. But when the word line X1 is actuated, capacitive coupling produces a disturbance on bit line BL and, in addition, the capacitance of the bit line BL is increased. At the point of intersection between word line X1 and the other bit line BR there is a disturbance capacitor CST through which the bit line BR is influenced in the same way as bit line BL is affected by the storage cell. Through this disturbance capacitor, therefore, disturbances are also transferred to the bit line BR and an increase in capacitance is produced on the bit line BR. Thus, some of the disturbances on the bit line BL are equalized by the disturbance capacitor, the rest is eliminated by the compensation cell. In addition, the moderate level needed for reliable reading is ensured on the bit line BR through the compensation cell DZ. This prevents the disturbances having any effect when a read signal is being evaluated.

Figure 4:
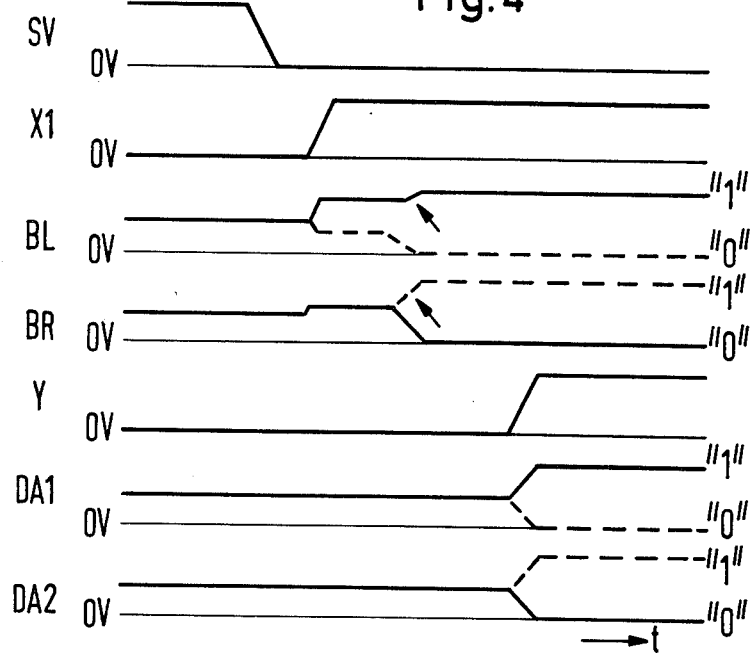
FIG. 4 is a pulse diagram for the circuit of FIG. 3.

The operation of the store shown in FIG. 3 is explained with reference to a pulse diagram illustrated in FIG. 4. Here, voltages are shown with respect to time $t$. First, the charging timing signal SV is applied and the charging transistors ML are rendered conductive. This allows the bit lines BL and BR to charge. This is shown in the third and fourth lines of FIG. 4. The data lines DA1 and DA2 are also charged. The charging timing signal SV is turned off and a signal is applied, e.g. to word line X1. This selects the storage cell connected between bit line BL and word line X1. A corresponding voltage change takes place on the bit line, depending upon whether the storage capacitor CS was charged or not, i.e. depending upon whether a binary "1" or a binary "0" was stored in the storage capacitor CS. If a binary "1" was stored, the voltage at the bit line BL rises (solid curve, line 3); bit if, in contrast, the information in the storage capacitor CS was a binary "0", the voltage on the bit line BL falls (broken curve in line 3). Thus, the voltage change on the bit line BL when a storage cell is selected is initially attributable to the information read out. At the same time, however, the bit line BL is affected by a disturbance, the cause of which has already been described above. This disturbance occurs simultaneously on the othe bit line BR through the compensation cell and the disturbance capacitor CST. This shown in the fourth line of FIG. 4. The compensation cell and the disturbance capacitor CST are so designed that the disturbance on the bit line BR match the disturbance arising on the bit line BL when the storage cell is selected.

At the points in time indicated by the arrow in lines 3 and 4 the weighting network BW begins to evaluate the read signal. Since the weighting network BW is a symmetrical flip-flop, this is switched into one stable state by the read signal that is present. This produces a voltage corresponding to that one stable state of the flip-flop circuit on one bit line BL, while a voltage is produced on the other bit line BR corresponding to the other stable state of the flip-flop. The corresponding conditions prevailing on the bit lines BL and BR are shown by solid and broken curves in the right-hand portions of lines 3 and 4 of FIG. 4. Here, the solid curves belong together and the broken ones belong together.

After the weighting network BW has evaluated the read signal, the selection transistors MA can be actuated by the signal Y. This transfers the voltage conditions on bit lines BL and BR to the data lines DA1 and DA2. This is shown in the last two lines in FIG. 4.

From there the signal passes to the read amplifier LV which amplifies this read signal and emits it at its output DO.

Here, the precise function of the compensation cells has not been examined in detail. The function of these compensation cells is well known in the art from the literature.

Figure 5:
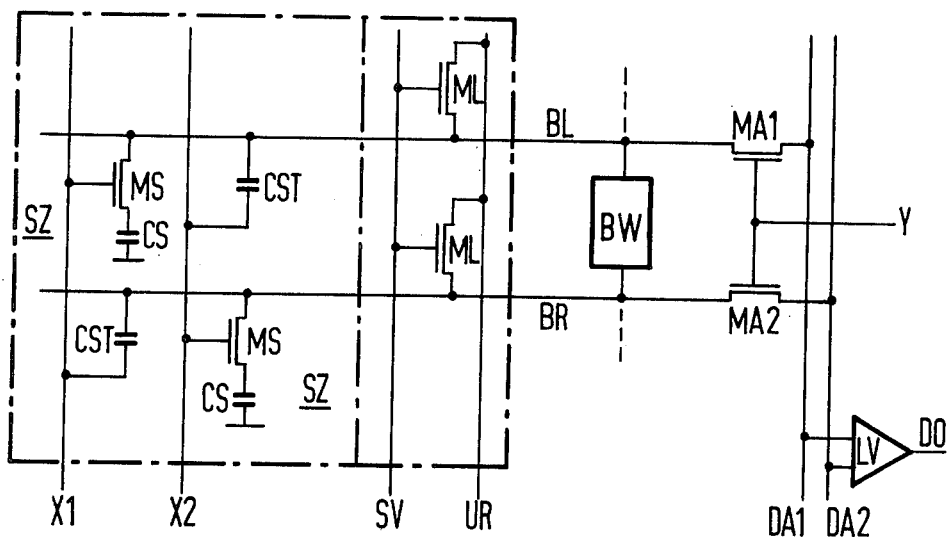
FIG. 5 is a schematic circuit diagram of a store without compensation cells.

Another exemplary embodiment is shown in FIG. 5. This embodiment differs from that in FIG. 3 in that no compensation cells DZ are provided. It is possible to omit the compensation cells when the increase in capacitance arising on one bit line through selection of a storage cell can be offset again with the aid of the disturbance capacitors CST. The disturbance capacitors can be appropriately designed for this purpose. The bit lines BL and BR can be charged to the moderate level required for reading with the aid of a reference voltage UR applied to the charging transistors ML. Otherwise, the store in FIG. 5 is identical to the store in FIG. 3.

Figure 6:
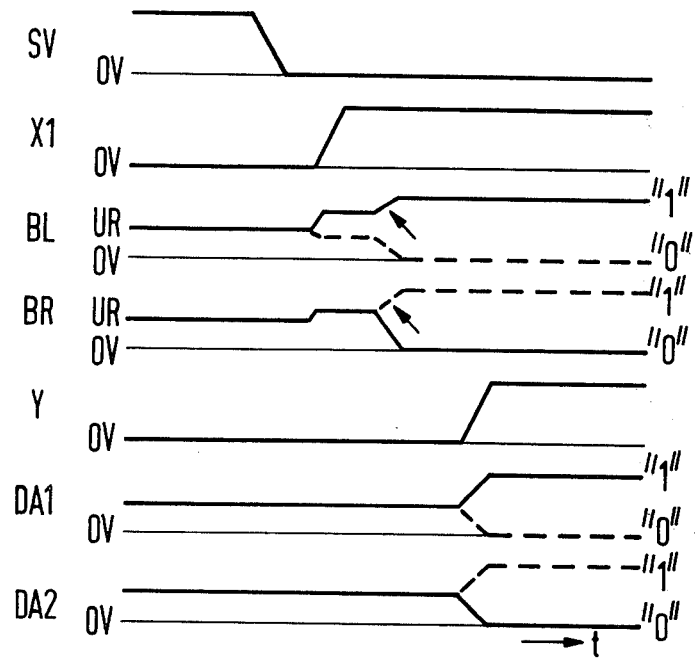
FIG. 6 is a pulse diagram for the circuit of FIG. 5.

FIG. 6 shows a pulse diagram for operation of the store in FIG. 5. Voltages are plotted against time $t$. The conditions are almost completely the same here as those shown in FIG. 4. The only difference lies in the fact that disturbance on the bit line which is not connected with the selected storage cell is now produced solely by the disturbance capacitor CST. With appropriate choice of the disturbance capacitor CST, the increase in capacitance on both bit lines and the capacitive coupling between word and bit lines can be made roughly the same in both bit lines.

Figure 7:
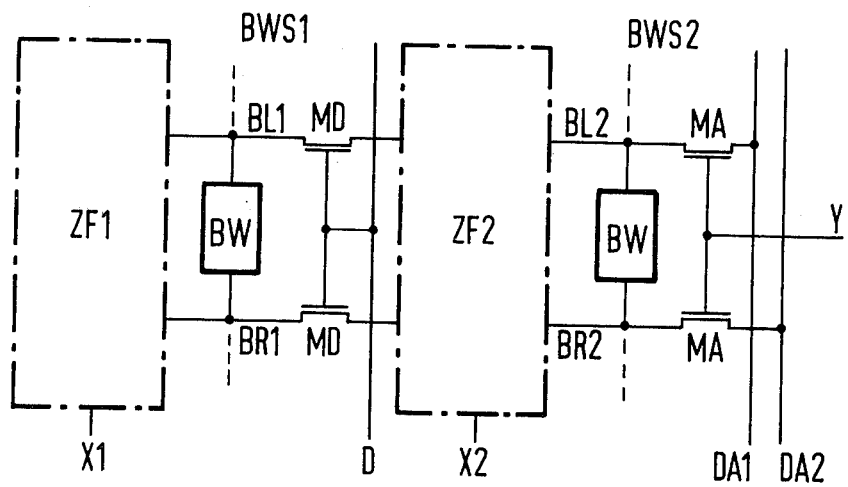
FIG. 7 is a schematic diagram illustrating the connection of storage cell fields one behind another.

FIG. 7 illustrates the case where one large storage cell field is divided into smaller storage cell fields, two in this example. This means shorter bit lines in a storage cell field. Each storage cell field ZF has its own column of weighting networks. For example, the storage cell field ZF1 has a column BWS1 of weighting networks BW and the storage cell field ZF2 has a column BWS2 of weighting networks BW. One weighting network is shown for each column BWS of weighting networks. Here again, the storage cell fields associated with one column of weighting networks lie on one side of the column of weighting networks. Here, the individual cell fields ZF are connected one behind another with the aid of connecting switches. This means that the bit lines are connected to the bit lines of the neighboring storage cell field through connecting switches. The bit lines BL1 and BR1 of storage cell field ZF1 are thus connected through connecting switches MD to the bit lines of storage cell field ZF2, BL2 and BR2 in this embodiment. The free ends of these bit lines are connected to data lines DA1 and DA2 through the selector switch MA. The connecting switches MD are actuated with the aid of a timing signal D while the signal Y is applied at the selection switches MA.

Figure 8:
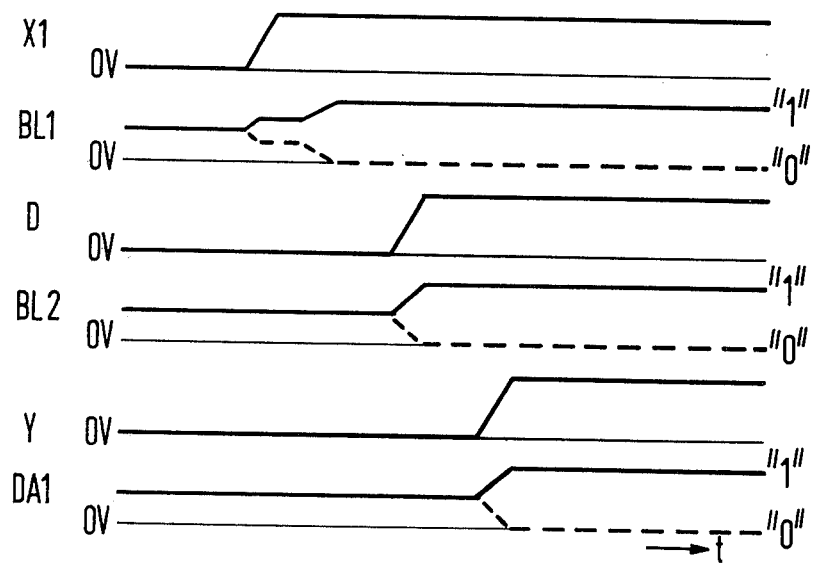
FIG. 8 is a pulse diagram for the circuit of FIG. 7.

The operation of the circuit arrangement in FIG. 7 is described with the aid of FIG. 8. For example, the word line X1 is selected in the storage cell field ZF1. The resulting read signal is fed to the weighting network BW in the column BWS1. This weighting network is activated and amplifies the read signal. Then the connecting transistors MD are actuated and made to conduct by a signal D. The amplified read signal is thus passed on via the bit lines BL2 and BR2 to the weighting network BW in the column BWS2 of weighting networks. This weighting network BW switches into the same state as the weighting network BW in the column BWS1. Once the weighting network BW in the column BWS2 has also reached a stable attitude, the signal Y can be applied to the selection transistors MA and the amplified read signal can be fed to the data lines DA1 and DA2.

The procedure is reversed during a recording operation. The information to be recorded is fed first to the bit lines BL2 and BR2 through the switches MA from the data lines DA1 and DA2. The weighting network BW in the column BWS2 is set accordingly. Then, the connecting transistors MD are made to conduct and the information is passed on to the weighting network in column BWS1. This weighting network is also switched into the corresponding state. The operation of recording in a storage cell then takes place through selection of a word line inside the storage field.

During a refresh operation the storage cell fields and their associated weighting networks always remain separated. This means the connecting transistors MD and the selection transistors MA are blocked. One column is called in each storage cell field, amplifying the read signals in the associated weighting network and feeding them back to the storage cells. This reduces the number of refresh cycles through dividing the large storage cell field into a plurality of parts.

The store in accordance with the invention can be produced from the technological standpoint with all MOS principles known to date. No particular technological problems arise through placing the storage cell field on one side of the weighting network.

An advantage of the store in accordance with the invention lies in the fact that the storage cells of the storage cell field are all disposed on one side of the weighting networks. This makes it possible to locate the weighting networks between the associated bit lines, to connect each bit line directly through a selection switch to a data line, to locate the selection switches next to one another, to locate the charging transistors next to one another also in the same way and to feed complementary signals passed to the data lines during the reading operation to both inputs of a read amplifier. Since the components working together during a reading or recording operation lie directly next to one another on the storage module, the properties of these components are essentially the same. Thus disturbances influence the weighting networks in the same way and are eliminated by the weighting network.

Although we have described our invention by reference to particular illustrative embodiments thereof, many changes and modifications may become apparent to those skilled in the art without departing from the spirit and scope thereof. We therefore intend to include within the patent warranted hereon all such changes and modifications as may reasonably and properly be included within the scope of our contribution to the art.

We claim:

1. A MOS semiconductor module comprising:
a plurality of word lines and a plurality of bit lines intersecting said word lines;
a plurality of MOS transistor storage cells arranged at the bit and word line intersections; and
a plurality of weighting networks arranged on the module in a column, each of said weighting networks including first and second inputs connected to a pair of associated bit lines,
the storage cells which are connected via bit lines to said first inputs of said weighting networks defining a first storage cell field,
the storage cells which are connected via bit lines to said second inputs of said weighting networks defining a second storage cell field, and
all storage cell fields of said module disposed on one side of said column of weighting network.

2. The module of claim 1, wherein:
said bit lines arranged on said modules with the bit lines which are connected to the same weighting network are adjacent one another with the associated weighting network therebetween.

3. The module of claim 1, wherein:
each of said word lines intersects each bit line of an associated pair of bit lines and a respective storage cell is connected between the word line and the respective bit lines.

4. The module of claim 3, comprising:
a capacitor connected between said word line and the bit line intersected thereby which does not have a storage cell connected therebetween.

5. The module of claim 1, comprising:
a pair of data lines for taking data from and feeding data to a weighting network; and
a pair of selection switches connecting respective ones of said data lines to said weighting network, each of said selection switches including an input for receiving a selection signal.

6. The module of claim 5, wherein:
said pair of selection switches are disposed adjacent each other on said module on the side of said weighting network opposite said storage cell fields.

7. The module of claim 1, comprising:
a plurality of charging transistors on said module arranged in pairs adjacent each other, each pair connected to the bit lines of associated with the same weighting network.

8. The module of claim 1, wherein:
a plurality of said storage cell fields and a respective column of said weighting networks arranged next to each other on said module.

9. The module of claim 8, comprising:
a pair of data lines on said module for taking data from and feeding data to said storage cell fields,
said fields connected one behind another to said data lines.

10. The module of claim 9, comprising:
isolation switches connected between said fileds for disconnecting said fields from each other.

* * * * *